United States Patent [19]
Lach et al.

[11] Patent Number: 5,909,451
[45] Date of Patent: Jun. 1, 1999

[54] SYSTEM AND METHOD FOR PROVIDING SCAN CHAIN FOR DIGITAL ELECTRONIC DEVICE HAVING MULTIPLE CLOCK DOMAINS

[75] Inventors: Jorge E. Lach, Lexington; Bennet H. Ih, Cambridge, both of Mass.

[73] Assignee: Sun Microsystems, Inc., Palo Alto, Calif.

[21] Appl. No.: 08/806,702

[22] Filed: Nov. 21, 1996

[51] Int. Cl.⁶ .................................................. H04B 17/00
[52] U.S. Cl. .................. 371/22.31; 371/22.1; 371/22.36
[58] Field of Search ................................ 371/22.31, 22.1, 371/22.36

[56] References Cited

U.S. PATENT DOCUMENTS

| | | | |
|---|---|---|---|
| 5,592,493 | 1/1997 | Crouch et al. | 371/22.3 |
| 5,719,878 | 2/1998 | Yu et al. | 371/22.3 |

*Primary Examiner*—Phung M. Chung
*Attorney, Agent, or Firm*—Richard A. Jordan

[57] ABSTRACT

A digital electronic circuit device comprises a plurality of circuit elements, a scan chain establishment element, and a unitary clock domain establishment element. The plurality of circuit elements define a plurality of clock domains, and circuit elements in each clock domain perform processing operations under control of a respective domain clock signal. The scan chain establishment element interconnects the circuit elements in a scan chain to facilitate loading and/or retrieval of a scan vector into and/or out of the digital circuit device. The unitary clock domain establishment element establishes a unitary clock domain for the circuit element when the scan chain establishment element is interconnecting the circuit elements in a scan chain. Thus, the scan vector will be loaded into or retrieved from the digital electronic circuit device using the single, unitary clock signal, thereby avoiding any necessity of using synchronizers or other elements for the scan chain which can complicate layout of the device.

38 Claims, 3 Drawing Sheets

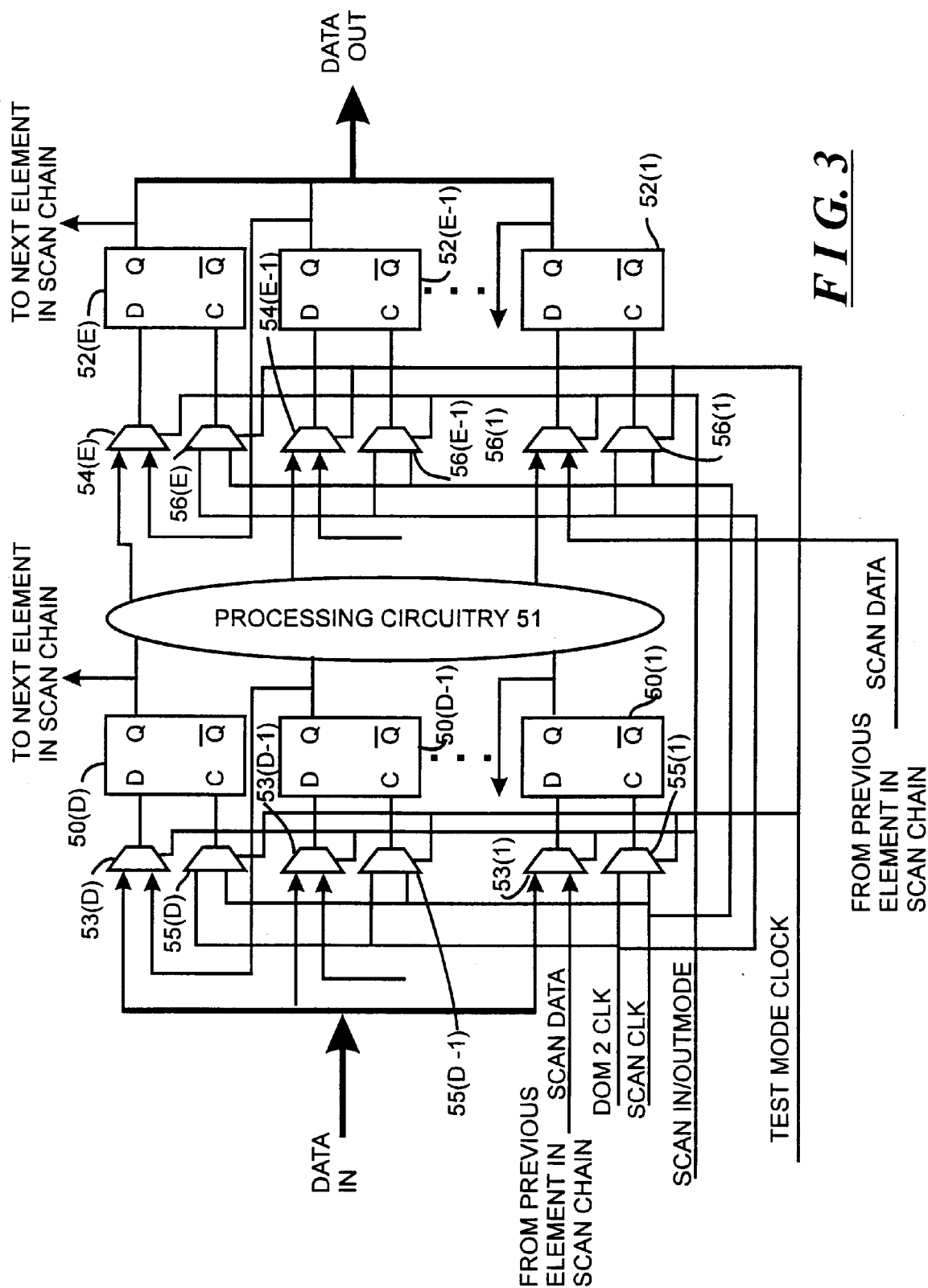

SYSTEM AND METHOD FOR PROVIDING SCAN CHAIN FOR DIGITAL ELECTRONIC DEVICE HAVING MULTIPLE CLOCK DOMAINS

FIELD OF THE INVENTION

The invention relates generally to the field of digital electronic devices and more particularly to systems and methods for providing a scan chain for a digital electronic device which has multiple clock domains. The scan chain can be of assistance in verifying that such devices are operating satisfactorily and in identifying particular ones of such devices' components that may be operating incorrectly.

BACKGROUND OF THE INVENTION

Digital electronic devices typically comprise a large number of circuit elements, all of which generally need to operate satisfactorily in order for the devices to work correctly. Basically, a digital device comprises a number of storage elements, such as flip-flops and registers which store digital information, which are interconnected by processing elements, which perform processing operations in connection with the information in a series of processing steps controlled by one or more clock signals. The particular processing operations that are performed by the processing elements in connection with information in one storage element may be as simple as, for example, transferring the information contained in one the storage element to another storage element. Alternatively, the processing elements may perform quite complex processing operations, representing a complex mathematical or other transformation of the information. In addition, particular processing elements may perform processing operations which are predetermined and fixed, or they may perform a variety of types of processing operations determined by digital information which, in turn, may be stored in ones of the storage elements which are provided to control the processing elements. Generally, the collection of processing elements comprising a device defines the device's state, which state can be modified by successive ticks of the clocking signal(s).

A variety of methodologies have been developed and used over the years to assist in verifying that digital devices were operating correctly, and if not provide guidance as to which components should be repaired or replaced to provide correct operation. Recently, a test methodology has been developed whereby state information is scanned into a device to place the device in a particular state. In the scanning operation, all of the information storage elements, including all of the flip-flops and registers in the device or in a component under test, are effectively connected in series and an input "vector" scanned in. After the device's state has been established, the clocking signal or signals controlling the device is or are advanced, allowing the processing elements to process the digital information defining the scanned-in state and the processed input state to be stored by the storage elements. The actual state vector defining the state at that point is then scanned out, and compared to an expected state vector representing the state vector which would be expected if the device were operating properly. If actual state vector corresponds to the expected state vector, the device will generally be considered to be operating properly. On the other hand, if the actual state vector does not correspond to the expected state vector, the device will be considered to not be operating properly, and the particular locations along the actual and expected state vectors at which they differ can be useful in determining and locating the malfunction.

Generally, a problem arises in using the scan test methodology in connection with digital devices which have multiple clock domains, that is, devices comprising a plurality of sections controlled by clock signals of different frequencies. Generally, if information is to be transferred between sections controlled by clock signals of different frequencies, synchronizing elements, such as delay elements, need to be provided to synchronize the transfers to avoid loss of information across the interface between the sections. Such synchronizing elements tend to increase the component count, which can also complicate component layout, particularly on integrated circuits, since the series of circuit elements through which the scan vector is scanned is arbitrary and can pass between the clock domains any number of times. In addition, particularly in connection with layout of integrated circuits, typically the sequence of the circuit elements comprising the scan chain for an integrated circuit is determined towards the end of the process of laying out components on the integrated circuit, in which case providing synchronizing elements along the scan chain can complicate the layout process.

SUMMARY OF THE INVENTION

The invention provides a new and improved system and method for providing a scan chain for a digital electronic device which comprises multiple clock domains.

In brief summary, the invention provides a digital electronic circuit device that comprises a plurality of circuit elements, a scan chain establishment element, and a unitary clock domain establishment element. The plurality of circuit elements define a plurality of clock domains, and circuit elements in each clock domain perform processing operations under control of a respective domain clock signal. The scan chain establishment element interconnects the circuit elements in a scan chain to facilitate loading and/or retrieval of a scan vector into and/or out of the digital circuit device. The unitary clock domain establishment element establishes a unitary clock domain for the circuit element when the scan chain establishment element is interconnecting the circuit elements in a scan chain. Thus, the scan vector will be loaded into or retrieved from the digital electronic circuit device using the single, unitary clock signal, thereby avoiding any necessity of using synchronizers or other elements for the scan chain which can complicate layout of the device.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 2 and 3 comprise detailed logic diagrams of illustrative circuit elements that are used in the respective clock domains depicted in FIG. 1, which together illustrate the inventive scan chain arrangement used in the device depicted in FIG. 1.

DETAILED DESCRIPTION OF AN ILLUSTRATIVE EMBODIMENT

Figure 1:
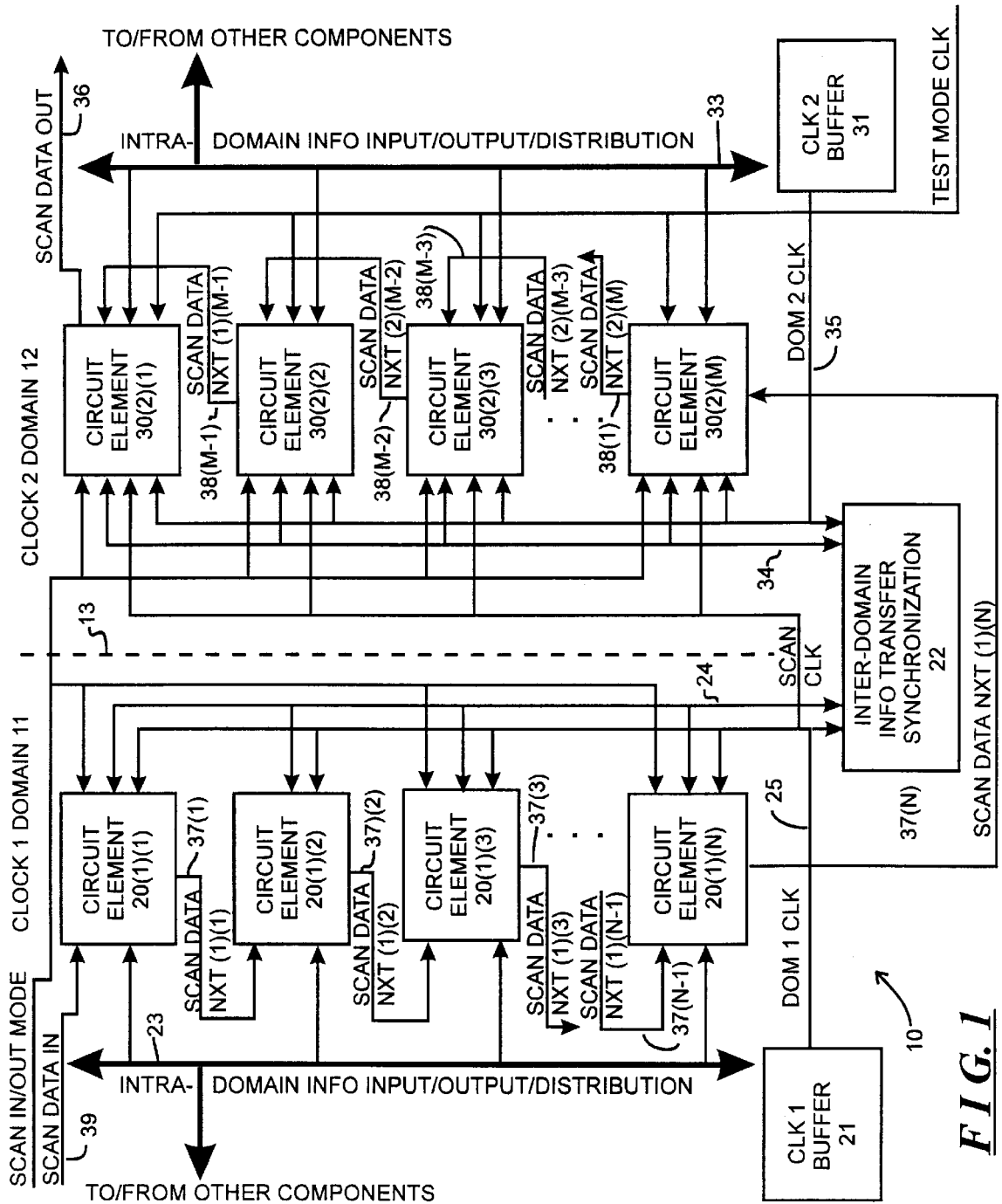
FIG. 1 is a functional block diagram of an illustrative digital electronic device, such as an integrated circuit, having multiple clock domains, incorporating a scan chain arrangement constructed in accordance with the invention.

FIG. 1 is a functional block diagram of an illustrative digital electronic device 10 which incorporates a scan chain, constructed in accordance with the invention. The scan chain accommodates loading of scan vectors into and retrieval of scan vectors from the device 10. The device 10 may comprise any of a number of types of digital electronic devices, including, by way of example but not limitation, microprocessors, memory devices, switching devices and special purpose "ASICs" (application-specific integrated circuits). In addition, the device 10 may be composed of, for example, a monolithic integrated circuit device or a plurality of such monolithic integrated circuit devices. Device 10 may comprise a component of a larger system, which may include other components (not separately shown), such as other digital electronic devices and/or connections to input devices for providing input signals to the device 10 which represent information to be processed by the device 10, connections to output devices for receiving output signals from device 10 which represent information that has been processed by the device 10, and the like. In addition, device 10 includes connections for receiving input test signals which represent digital information for testing purposes, and for providing output test signals which represent results of such testing, as will be described below.

The illustrative device 10 is depicted as including two clock domains, identified in FIG. 1 as clock 1 domain 11 and clock 2 domain 12. Each domain 11, 12 comprises a number of circuit elements which process information under control of a respective clock signal, with the clock signals which control the respective domains 11 and 12 having different frequencies and/or phases. More specifically, the clock 1 domain 11 includes elements to the left of a vertical dashed line identified by reference numeral 13, generally including a number of circuit elements 20(1)(1) through 20(1)(N) (generally identified by reference numeral 20(1)(n)) and a clock 1 buffer 21. The circuit elements 20(1)(n) comprising clock 1 domain 11 may perform a number of general operations, including (i) receiving signals representing information to be processed, (ii) performing selected operations in connection with the information represented by the signals, including processing the information, storing the information, or the like (generally "processing"), and (iii) generating output signals which represents processed information, all under control of a DOM 1 CLK domain 1 clock signal from the clock buffer 21. An illustrative circuit element 20(1)(n) for use in the clock 1 domain 11 will be described in detail below in connection with FIG. 2.

The signals received by ones of the circuit elements 20(1)(n) may be provided by a number of sources, including other components (not shown) comprising a system which includes device 10, clock 2 domain 12 through inter-domain signal synchronizing circuitry represented by an inter-domain information transfer synchronization element 22. In addition, ones of the circuit elements 20(1)(n) may receive signals representing information to be processed from others of the circuit elements 20(1)(n')(n'≠n). Processed information generated by each of the respective circuit elements 20(1)(n) may be transferred to other components in the system that includes device 10 for further processing or utilization. In particular, processed information generated by a circuit element 20(1)(n) may be transferred to other circuit elements 20(1)(n')(n'≠n) for further processing. Processed information may also be transferred to the clock 2 domain 12 for further processing through the inter-domain information transfer synchronization elements 22. The circuit elements 20(1)(n) comprising clock 1 domain 11 will generally be connected to one or more connections generally represented by line 23 to facilitate the reception of information from and transfer of information to other components in the system. In addition, line 23 further generally represents connections which various ones of the circuit elements 20(1)(n) will use to facilitate the transfer information with other circuit elements in the same clock 1 domain 11. The device 10 provides one or more other busses, represented by line 24, which circuit elements 20(1)(n) will use to transfer information to inter-domain information transfer synchronization elements 22 for transfer to the clock 2 domain 12, and in addition to receive information provided by the clock 2 domain 12 through the inter-domain information transfer synchronization elements 22 for processing.

The clock 1 buffer 21 generates the DOM 1 CLK domain 1 clock signal which is coupled to the circuit elements 20(1)(n) in the clock 1 domain 11 to control the operational timing thereof. As an illustration, and as will be described below in connection with FIG. 2, the circuit elements 20(1)(n) may include a number of storage devices such as flip-flops, registers and the like, and the DOM 1 CLK domain 1 clock signal may be used to control the timing of storage of information in such storage devices. In addition, the DOM 1 CLK domain 1 clock signal may be used, for example, to control the gating of signals representing information over the respective connections 23 and 24. The DOM 1 CLK domain 1 clock signal is provided to the various circuit elements 20(1)(n) over a clock tree 25, which is preferably implemented to provide predetermined phasing relationships for the various circuit elements 20(1)(n) in the clock 1 domain 11.

The clock 2 domain 12 includes elements to the right of the vertical dashed line 13. The clock 2 domain 12 is generally similar to clock 1 domain 11 described above, and in particular generally includes a number of circuit elements 30(2)(1) through 30(2)(M) (generally identified by reference numeral 30(2)(m)) and a clock 2 buffer 31. The circuit elements 30(2)(m) comprising clock 2 domain 12 may perform a number of general operations, including (i) receiving signals representing information to be processed, (ii) processing the information represented by the signals, and (iii) generating output signals which represent processed information, all under control of a DOM 2 CLK domain 2 clock signal from the clock buffer 31. An illustrative circuit element 30(2)(m) for use in the clock 2 domain 12 will be described in detail below in connection with FIG. 3.

The signals received by ones of the circuit elements 30(2)(m) may be provided by a number of sources, including other components (not shown) comprising a system which includes device 10, and clock 1 domain 11 through the inter-domain signal synchronizing circuitry represented by the inter-domain information transfer synchronization element 22. In addition, ones of the circuit elements 30(2)(m) may receive signals representing information to be processed from others of the circuit elements 30(2)(m')(m'≠m). Processed information generated by each of the respective circuit elements 30(2)(m) may be transferred to other components in the system that includes device 10 for further processing or utilization. In particular, processed information generated by a circuit element 30(2)(m) may be transferred to other circuit elements 30(2)(m')(m'≠m) for further processing. Processed information may also be transferred to the clock 1 domain 11 for further processing through the inter-domain information transfer synchronization element 22. The circuit elements 30(2)(m) comprising clock 2 domain 12 will generally be connected to one or more connections generally represented by line 33 to facilitate the reception of information from and transfer of information to other components in the system. In addition, line 33 further generally represents connections which various ones of the circuit elements 30(2)(m) will use to facilitate the transfer information with other circuit elements in the same clock 2 domain 12. The device 10 provides one or more other connections, represented by line 34, which circuit elements 30(2)(m) will use to transfer information to inter-domain information transfer synchronization elements 22 for transfer to the clock 1 domain 11, and in addition to receive information provided by the clock 1 domain 11 through the inter-domain information transfer synchronization elements 22 for processing.

The clock 2 buffer 31 generates the DOM 2 CLK domain 2 clock signal which is coupled to the circuit elements 30(2)(m) in the clock 2 domain 12 to control the operational timing thereof. As an illustration, and as will be described below in connection with FIG. 2, the circuit elements 30(2)(m) may include a number of storage devices such as flip-flops, registers and the like, and the DOM 2 CLK domain 2 clock signal may be used to control the timing of storage of information in such storage devices. In addition, the DOM 2 CLK domain 2 clock signal may be used, for example, to control the gating of signals representing information over the respective connections 33 and 34. The DOM 2 CLK domain 2 clock signal is provided to the various circuit elements 30(2)(m) over a clock tree 35, which is preferably implemented to provide predetermined phasing relationships for the various circuit elements 30(2)(m) in the clock 2 domain 12.

As indicated above, device 10 further includes connections for receiving input test signals which represent digital information for testing purposes, and for providing output test signals which represent results of such testing. In particular, the device 10 includes a connection, represented by a line 39, for receiving a SCAN DATA IN signal, which represents the digital test information to be used in testing the circuit elements 20(1)(n) and 30(2)(m) comprising device 10. In addition, device 10 includes a second connection, represented by a line 36, for receiving a SCAN DATA OUT signal, which represents processed test data. A test operation generally proceeds in three phases, namely, (i) loading a scan test vector representing digital test information into the device 10;

(ii) allowing the clocks of the device to advance by a respective predetermined number of clock ticks, thereby to enable the circuit elements 20(1)(n) and 30(2)(m) of the device 10 perform a predetermined number of processing operations in connection with the digital test information, thereby to generate processed digital test information; and (iii) retrieving the processed digital test information as a scan result vector from the device 10.

(A clock signal "tick" refers here to a transition in the clock signal, which may constitute a positive transition and/or a negative transition, which will enable the respective storage elements controlled by the clock signal to receive and store information at their respective inputs.) Typically, the number of ticks by which the clocks are allowed to advance (item (ii)) is limited to one, although it will be appreciated that the clocks may be advanced by any number of ticks. By comparing the actual processed digital test information provided by the device 10 to processed digital test information which would be expected if the device 10 were operating properly, a determination can be made as to whether or not the device 10 is, in fact, operating properly. In addition, if there is a difference between the actual processed digital test information provided by device 10 and the expected digital test information, the portions of the scan vectors representing the respective actual and expected processed digital test information which differ can be useful in identifying the portion or portions of the device 10 which are not operating properly.

More specifically, the scan test vector comprises a series of bits $<TV_1 \ldots TV_K>$ (individual ones of which are generally identified by "$<TV_k>$"), which are provided serially for loading into device 10. The scan test vector may be provided by an external component (not shown) which is part of a system which includes device 10, or by a scan vector source which is connected to the system for testing purposes. In loading the scan test vector into device 10 (item (i) above), bit $<TV_1>$ is provided first, bit $<TV_2>$ is provided next, and so forth.

During the loading operation, a SCAN IN/OUT MODE signal and a TEST MODE CLK signal will be both asserted. The asserted SCAN IN/OUT MODE signal enables ones of the storage elements contained in the circuit elements 20(1)(n) and 30(2)(m) which are to receive bits $<TV_k>$ comprising the scan test vector are connected in a "scan chain" that is defined by effectively connecting those storage elements in series for purposes of the loading operation. The TEST MODE CLK signal enables the DOM 1 CLK domain 1 clock signal to be coupled to control the clocking of the storage elements of the clock 2 domain 12, so that those storage elements (that is, the storage elements of the clock 2 domain 12) operate synchronously with the storage elements of the clock 1 domain 11. The storage elements comprising the scan chain may comprise all of the storage elements in all of the circuit elements 20(1)(n) and 30(2)(m) comprising the device 10, or alternatively they may comprise a selected sub-set of those storage elements. The scan chain may include storage elements in all or a selected subset of the circuit elements 20(1)(n) and 30(2)(m). Preferably, the storage elements which comprise the scan chain are those which comprise portions of circuit elements of the device 10 for which testing is deemed desirable, using criteria which are known in the art. In the device 10, each of the circuit elements 20(1)(n) and 30(2)(m) includes at least one storage element in the scan chain, and lines, generally identified by reference numeral 37(n) and 38(m), are provided to connect storage elements in the respective circuit elements 20(1)(n) and 30(2)(m) in series. In the illustrative device 10 depicted in FIG. 1, all of the circuit elements 20(1)(n) and 30(2)(m) in the respective clock domains 11 and 12 are connected in series and only one line, namely, line 37(N) interconnects circuit elements 20(1)(n) and 30(2) (m) in different clock domains; however, but it will be appreciated that, depending on the layout of circuit elements in the various domains in an actual embodiment, several lines defining the scan chain may interconnect circuit elements in different clock domains.

In the following, storage elements comprising the scan chain will be identified as $<SC_1>$, $<SC_2>$, and so forth, (generally, $<SC_j>$). The subscript ("j") identifies the position of the storage element in the scan chain relative to the storage element connected to line 39; that is, the storage element that is connected to line 39, and which initially receives the bits of the scan chain, is identified as $<SC_1>$, the next storage element in the scan chain will be identified as $<SC_2>$, and so forth. It will be appreciated that preferably the number of bits $<TV_k>$ comprising the scan vector, that is, "K," will correspond to at least the number of storage elements $<SC_j>$ in the scan chain, that is, "J" (that is, $K \geq J$), which, as will be apparent from the following, will ensure that each storage element $<SC_j>$ in the scan chain receives a bit $<TV_k>$ of the scan vector. Indeed, as will further be apparent from the following, if K=J (that is, if the number of bits <TV$_k$> in the scan vector provided to device 10 is equal to the number of storage elements <SC$_j$> in the scan chain, at the end of the loading operation (item (i) above) storage element <SC$_x$> ("x" having a value from "1" to "J") will be loaded with bit <TV$_{K-x}$> of the scan vector.

During the loading of the scan vector (item (i) above), in accordance with the invention, the successive bits <TV$_k$> of the test scan vector are shifted through the successive storage elements <SC$_j$> of the scan chain under control of a single clock signal. The single clock signal is provided to each of the storage each of the storage elements <SC$_j$> in the scan chain, and at each successive tick "T" of the clock signal, the respective bit <TV$_k$> of the test scan vector is shifted into storage element <SC$_{T-k+1}$> of the scan chain from the previous storage element <SC$_{T-k}$> in the scan chain, or, in the case of the first storage element of the scan chain, from the line 39. In the particular embodiment depicted in FIG. 1, the DOM 1 CLK domain 1 clock signal is used to control the loading of the scan vector through the storage elements comprising the scan chain in the circuit elements 20(1)(n) and 30(2)(m) of both clock 1 domain 11 and clock 2 domain 12. Accordingly, the DOM 1 CLK domain 1 clock signal, in addition to being coupled to the circuit elements 20(1)(n) of clock 1 domain 11, is also coupled as a SCAN CLK scan clock signal to those circuit elements 30(2)(m) of the clock 2 domain 12 which contain storage elements <SC$_j$> in the scan chain for device 10.

As indicated above, and with continued reference to FIG. 1, during loading of the test scan vector the storage elements <SC$_j$> of the scan chain are effectively connected in series and the successive bits <TV$_k$> of the test scan vector are shifted therethrough, until each storage element <SC$_j$> contains a bit <TV$_{K-j}$> of the test scan vector. After the test scan vector is loaded into the scan chain, the SCAN IN/OUT MODE signal is negated, which enables the storage elements comprising the scan to resume their normal operational configuration. Thereafter, the DOM 1 CLK domain 1 clock can be advanced by a predetermined number of clock ticks, thereby to enable the circuit elements 20(1)(n) of the device to perform a predetermined number of processing operations in connection with the portion of the test scan vector loaded in the storage elements in those circuit elements. In addition, by means of the SCAN CLK signal (which conforms to the DOM 1 CLK domain 1 clock signal), the circuit elements 30(2)(m) of the device 10 will also perform a predetermined number of processing operations in connection with the test information defined by the test scan vector. In both cases, the circuit elements 20(1)(n) and 30(2)(m) operate in a manner similar to that in which the would normally operate in connection with the information provided by the test scan vector. The result of these processing operation(s) (item (ii) above) is to generate processed digital test information which can be retrieved from the device 10 (item (iii) above) as a SCAN DATA OUT signal over line 36.

The processed digital test information retrieval operation (item (iii) above) will provide a scan result vector comprising a series of bits <RV$_1$ ... RV$_1$> (individual ones of which are generally identified by <RV$_i$>). The scan result vector may be provided to an external component (not shown) which is part of a system which includes device 10, or to a scan vector destination which is connected to the system for testing purposes. In retrieving the scan result vector from device 10 (item (iii) above), bit <RV$_1$> is received first, bit <RV$_2$> is received next, and so forth.

In a manner similar to the test scan vector loading operation (item (i) above), during the processed digital test information retrieval operation (item (iii) above), the SCAN IN/OUT MODE signal and TEST MODE CLK both asserted, enabling ones of the storage elements contained in the circuit elements 20(1)(n) and 30(2)(m) which are to provide bits <RV$_i$> comprising the scan result vector to be connected in a "scan chain" that is defined by effectively connecting those storage elements in series for purposes of the retrieval operation. The storage elements comprising the scan chain for the retrieval operation may comprise all of the storage elements in all of the circuit elements 20(1)(n) and 30(2)(m) comprising the device 10, or alternatively they may comprise a selected sub-set of those storage elements, and in any case may (but need not) comprise those storage elements which form the scan chain for the scan test vector loading operation (item (i) above). In the following description, it will be assumed that the scan chain for the retrieval operation (item (iii) above) is the same as the scan chain for the loading operation (item (i) above), and the successive storage elements of the scan chain for the retrieval operation will be identified as <SC$_j$>.

During the retrieval of the scan vector (item (i) above), further in accordance with the invention, the successive bits <RV$_i$> of the result scan vector are shifted through the successive storage elements <SC$_j$> of the scan chain under control of a single clock signal. The single clock signal is provided to each of the storage elements <SC$_j$> in the scan chain, and at each successive tick "T" of the clock signal, the bit <RV$_T$>, which will be present in the last storage element <SC$_j$> in the chain, will be provided as the SCAN DATA OUT signal on line 36, and each of the other bits <RV$_i$> of the result scan vector will be shifted from storage element <SC$_{T-i}$> into storage element <SC$_{T-i+1}$> of the scan chain. As in the loading operation (item (i) above), in the embodiment depicted in FIG. 1, the DOM 1 CLK domain 1 clock signal is used to control the retrieval of the scan vector through the storage elements comprising the scan chain in the circuit elements 20(1)(n) and 30(2)(m) of both clock 1 domain 11 and clock 2 domain 12, with the DOM 1 CLK domain 1 clock signal providing the SCAN CLK scan clock signal to those circuit elements 30(2)(m) of the clock 2 domain 12 which contain storage elements <SC$_j$> in the scan chain for device 10. After the test scan vector is retrieved from the scan chain, the SCAN IN/OUT MODE signal is negated, which enables the storage elements comprising the scan chain to resume their normal operational configuration.

Figure 2:
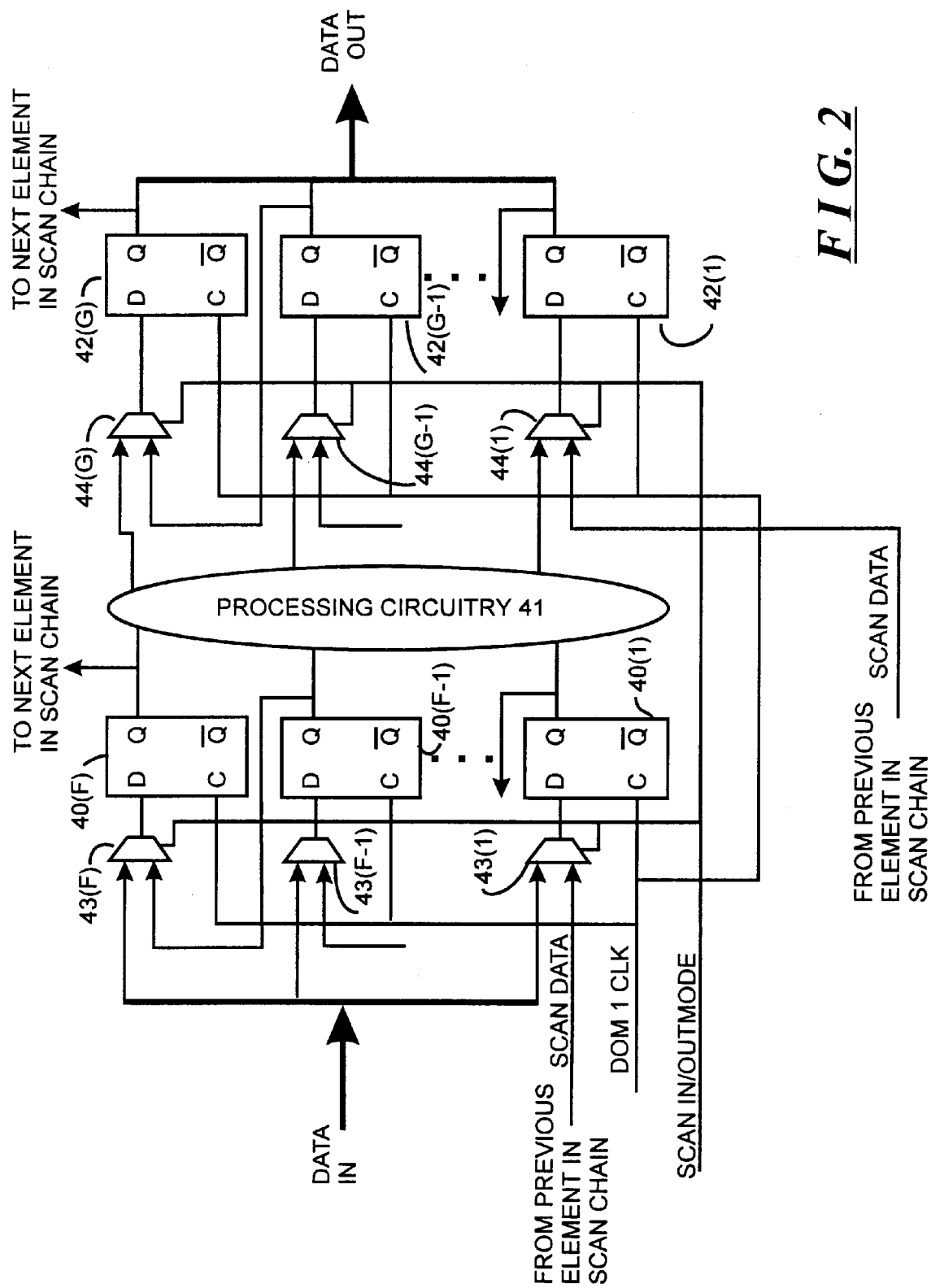

As indicated above, FIGS. 2 and 3 depict illustrative circuit elements 20(1)(n) and 30(2)(m), respectively, for use in the clock 1 domain 11 and clock 2 domain 12, to accommodate use of a single clock signal for use during the loading of a test scan vector (item (i) above), processing of the test scan vector through a predetermined number of clock tests (item (ii) above), and retrieval of a result scan vector (item (iii) above) from the device 10. With reference initially to FIG. 2, the illustrative circuit element 20(1)(n) comprises a plurality of storage elements represented as input flip-flops 40(1) through 40(F) (generally identified by reference numeral 40(f)), processing circuitry 41 and another plurality of storage elements represented as output flip-flops 42(1) through 42(G) (generally identified by reference numeral 42(g)). Each of the input flip-flops 40(f) stores information which is normally provided as signals to the processing circuitry 41. The processing circuitry receives signals representing information stored in the input flip-flops 40(f) and generates output signals which are to be loaded into the output flip-flops 42(g) as described below, the output signals representing a selected transformation of the information represented by the input signals provided by the input flip-flops 40(f).

Each of the input flip-flops 40(*f*) and output flip-flops 42(*g*) has an associated input data multiplexer generally identified by reference numeral 43(*f*) (in the case of input flip-flops 40(*f*)) and 44(*g*) (in the case of flip-flops 42(*g*)). The input data multiplexers 43(*f*) and 44(*g*), under control of the SCAN IN/OUT MODE signal, determine the signals that are to be coupled to the input terminal of their respective flip-flops 40(*f*) and 42(*g*), thereby to determine the source of the information loaded therein. As indicated above, the SCAN IN/OUT MODE signal will be in a negated condition during normal operation of the device 10 and during the scan vector processing operation (item (ii) above). On the other hand, the SCAN IN/OUT MODE signal will be in an asserted condition when a test scan vector is being loaded into the device 10 and when a result scan vector is being retrieved from the device 10. When the SCAN IN/OUT MODE signal is negated, each multiplexer 43(*f*) is enabled to couple a respective DATA IN signal, which may be provided by connection 23 (FIG. 1), and which the multiplexer 43(*f*) receives at one input terminal, to the data input terminal D of the flip-flop 40(*f*). Similarly, when SCAN IN/OUT MODE signal is negated, each multiplexer 44(*g*) is enabled to couple a respective signal from the processing circuitry 41, which the multiplexer 44(*g*) receives at one input terminal, to the data input D of the flip-flop 44(*g*). All flip-flops 40(*f*) and 42(*g*) receive the DOM 1 CLK domain 1 clock signal at their respective clock input terminals C, and at each tick of the DOM 1 CLK domain I clock signal each flip-flop 43(*f*) and 44(*g*) will store the state of the signal provided by the respective multiplexer 43(*f*) or 44(*g*).

On the other hand, when the SCAN IN/OUT MODE signal is asserted, the multiplexers 43(*f*) effectively connect the input flip-flops 40(*f*) in series and multiplexers 44(*g*) connect the output flip-flops 42(*g*) in series, to form respective segments of the scan chain for device 10. It will be appreciated that the flip-flops 40(*f*) and 42(*g*) individually form elements <$SC_j$> of the scan chain for device 10 as described above in connection with FIG. 1. In the illustrative circuit element 20(1)(n) depicted in FIG. 2, the input flip-flops 40(*f*) are effectively connected in a first series, and the output flip-flops 42(*g*) are also effectively connected in a second series, thereby to define respective segments of the scan chains. To effect the series connection for input flip-flops 40(*f*), the output terminal of each of the flip-flops 40(*f*) is, in addition to being connected to the processing circuitry 41, also connected to a second input terminal of the multiplexer 43(f+1) associated with the flip-flop 40(f+1). Thus, the output terminal of flip-flop 40(1) is connected to the second input terminal of multiplexer 43(2), the output terminal of flip-flop 40(2) is connected to the multiplexer 43(3), and so forth. The second input terminal of the multiplexer 43(1) associated with the first flip-flop 40(1) is connected to receive a SCAN DATA signal from a preceding storage element in the scan chain, or the SCAN DATA IN signal (FIG. 1) if the flip-flop 40(1) is the first storage element <$SC_1$> in the scan chain. The output terminal of the last flip-flop 40(F) in the series of input flip-flops is connected to the next storage element in the scan chain, or it provides the SCAN DATA OUT signal if the flip-flop 40(F) is the last storage element in the scan chain.

Similarly, to effect the series connection for output flip-flops 42(*g*), the output terminal of each of the flip-flops 42(*g*) is, in addition to being connected to the connection 23, also connected to a second input terminal of the multiplexer 44(g+1) associated with the output flip-flop 40(g+1). Thus, the output terminal of flip-flop 42(1) is connected to the second input terminal of multiplexer 44(2), the output terminal of flip-flop 42(2) is connected to the multiplexer 44(3), and so forth. The second input terminal of the multiplexer 44(1) associated with the first flip-flop 42(1) is connected to receive a SCAN DATA signal from a preceding storage element in the scan chain, or the SCAN DATA IN signal (FIG. 1) if the flip-flop 42(1) is the first storage element <$SC_1$> in the scan chain. The output terminal of the last flip-flop 42(G) in the series of input flip-flops is connected to the next storage element in the scan chain, or it provides the SCAN DATA OUT signal if the flip-flop 42(G) is the last storage element in the scan chain.

With the SCAN IN/SCAN OUT MODE signal asserted, and the multiplexers 43(*f*) and 44(*g*) conditioned to effectively connect the flip-flops 40(*f*) and 42(*g*) in their respective series, at each successive tick of the DOM 1 CLK domain 1 clock signal, each flip-flop 40(*f*) and 42(*g*) will store the signal at its respective data input terminal, which as described above is provided by the respective preceding flip-flop 40(f−1) or 42(g−1), or the respective SCAN DATA signal in the case of flip-flops 40(1) and 42(1), coupled thereto by the associated multiplexers 43(*f*) and 44(*g*). After each flip-flop 40(*f*), 42(*g*) has stored the signal at its data input terminal "D," it will couple the signal through its data output terminal "Q" and the multiplexer 43(f+1), 44(g+1) will, in turn, provide the signal to the data input terminal D of its associated flip-flop 43(f+1), 44(g+1). Thus, at successive ticks of the DOM 1 CLK domain 1 clock signal, the bits of the scan vector represented by the state of the signals provided to the flip-flop 40(1) and 42(1) will be shifted through the segments of the scan chain defined by respective flip-flops 40(*f*) and 42(*g*). It will be appreciated that, while the SCAN IN/SCAN OUT MODE signal is asserted, the processing circuitry 41 will be receiving the signals from the flip-flops 40(*f*) and may be generating output signals in response thereto which are coupled to the respective inputs of multiplexers 42(*g*), but the SCAN IN/SCAN OUT MODE signal, by enabling each multiplexer 42(*g*) to couple the signal from the preceding flip-flop 42(g−1) in the scan chain (or, in the case of multiplexer 42(1), the SCAN DATA signal provided thereto) to its respective flip-flop 42(*g*), the output signals from the processing circuitry 41 will be ignored. Similar operations will generally occur both when the test scan vector is being scanned into the device 10 during a test vector loading operation (item (1) above), and when the result scan vector is being scanned out of the device 10 during a result vector retrieval operation (item (iii) above).

With reference to FIG. 3, the illustrative circuit element 30(2)(m) in the clock 2 domain 12 is structured generally similarly to the circuit element 20(1)(n), and comprises a plurality of storage elements represented as input flip-flops 50(1) through 50(D) (generally identified by reference numeral 50(*d*)), processing circuitry 51 and another plurality of storage elements represented as output flip-flops 52(1) through 52(E) (generally identified by reference numeral 52(*e*)). Each of the input flip-flops 50(*d*) stores information which is normally provided as signals to the processing circuitry 51. The processing circuitry receives signals representing information stored in the input flip-flops 50(*d*) and generates output signals which are to be loaded into the output flip-flops 52(*e*) as described below, the output signals representing a selected transformation of the information represented by the input signals provided by the input flip-flops 50(*d*).

Each of the input flip-flops 50(*d*) and output flip-flops 52(*e*) has an associated input data multiplexer generally identified by reference numeral 53(*d*) (in the case of input flip-flops 50(*d*)) and 54(*e*) (in the case of flip-flops 52(*e*)).

The multiplexers 53(d) and 54(e), under control of the SCAN IN/OUT MODE signal, determine the signals that are to be coupled to the input terminal of their respective flip-flops 50(d) and 52(e), thereby to determine the source of the information loaded therein. As indicated above, the SCAN IN/OUT MODE signal will be in a negated condition during normal operation of the device 10 and during the scan vector processing operation (item (ii) above). On the other hand, the SCAN IN/OUT MODE signal will be in an asserted condition when a test scan vector is being loaded into the device 10 or when a result scan vector is being retrieved from the device 10. When the SCAN IN/OUT MODE signal is negated, each multiplexer 53(d) is enabled to couple a respective DATA IN signal, which may be provided by bus 33 (FIG. 1), and which the multiplexer 53(d) receives at one input terminal, to the data input terminal D of the flip-flop 50(d). Similarly, when SCAN IN/OUT MODE signal is negated, each multiplexer 54(e) is enabled to couple a respective signal from the processing circuitry 51, which the multiplexer 54(e) receives at one input terminal, to the data input D of the flip-flop 54(e).

In accordance with the invention, each of the flip-flops 50(d) and 52(e) also has an associated respective multiplexer 55(d) and 56(e) for selectively coupling one of the DOM 2 CLK domain 2 clock signal or the SCAN CLK signal (which, as described above, corresponds to the DOM 1 CLK domain 1 clock signal) to the clock input terminal "C" of its respective flip-flop 50(d), 52(e), under control of the TEST MODE CLK signal. The multiplexers 55(d) and 56(e) are controlled by the TEST MODE CLK signal. Accordingly, when the TEST MODE CLK signal is negated, during normal operation, all flip-flops 50(d) and 52(e) receive the DOM 2 CLK domain 2 clock signal at their respective clock input terminals C. On the other hand, when the TEST MODE CLK signal is asserted, during the loading of a scan vector in the device 10 (item (i) above), during processing of a test vector (item (ii) above), and during retrieval of a scan vector from the device 10 (item (iii) above), all flip-flops 50(d) and 52(e) receive the SCAN CLK scan clock signal at their respective input terminals C. In that case, at each tick of the SCAN CLK signal, each flip-flop 53(d) and 54(e) will store the state of the signal provided by the respective multiplexer 53(d) or 54(e), but it will be appreciated that, when the TEST MODE CLK signal is asserted, the device 10 effectively forms a single clock domain, controlled by the DOM 1 CLK signal, whereas when the TEST MODE CLK signal is negated the device 10 effectively comprises the two clock domains 11 and 12 depicted in FIG. 1.

More specifically, when the SCAN IN/OUT MODE signal is asserted, the multiplexers 53(d) effectively connect the input flip-flops 50(d) in series and multiplexers 54(e) connect the output flip-flops 52(e) in series, to form respective segments of the scan chain for device 10. In addition, when the TEST MODE CLK signal is asserted, multiplexers 55(d) and 56(e) couple the SCAN CLK signal to the clock input terminals C of their respective flip-flops 50(d) and 52(e). As with the flip-flops 40(f), 42(g) of the circuit element 20(1)(n), the flip-flops 50(d) and 52(e) of circuit element 30(2)(m) individually form elements <$SC_j$> of the scan chain for device 10 as described above in connection with FIG. 1. In the illustrative circuit element 30(2)(m) depicted in FIG. 3, the input flip-flops 50(d) are effectively connected in a first series, and the output flip-flops 52(e) are also effectively connected in a second series, thereby to define respective segments of the scan chains. To effect the series connection for input flip-flops 50(d), the output terminal of each of the flip-flops 50(d) is, in addition to being connected to the processing circuitry 51, also connected to a second input terminal of the multiplexer 53(f+1) associated with the flip-flop 50(d+1). Thus, the output terminal of multiplexer flip-flop 50(1) is connected to the second input terminal of multiplexer 53(2), the output terminal of flip-flop 50(2) is connected to the multiplexer 53(3), and so forth. The second input terminal of the multiplexer 53(1) associated with the first flip-flop 50(1) is connected to receive a SCAN DATA signal from a preceding storage element in the scan chain, or the SCAN DATA IN signal (FIG. 1) if the flip-flop 50(1) is the first storage element <$SC_1$> in the scan chain. The output terminal of the last flip-flop 50(d) in the series of input flip-flops is connected to the next storage element in the scan chain.

Similarly, to effect the series connection for output flip-flops 52(e), the output terminal of each of the flip-flops 52(e) is, in addition to being connected to the bus 33, also connected to a second input terminal of the multiplexer 52(e+1) associated with the output flip-flop 52(e+1). Thus, the output terminal of flip-flop 52(1) is connected to the second input terminal of multiplexer 54(2), the output terminal of flip-flop 52(2) is connected to the multiplexer 54(3), and so forth. The second input terminal of the multiplexer 54(1) associated with the first flip-flop 52(1) is connected to receive a SCAN DATA signal from a preceding storage element in the scan chain, or the SCAN DATA IN signal (FIG. 1) if the flip-flop 52(1) is the first storage element <$SC_1$> in the scan chain. The output terminal of the last flip-flop 52(G) in the series of input flip-flops is connected to the next storage element in the scan chain.

With the SCAN IN/SCAN OUT MODE signal and TEST MODE CLK signal both asserted, and the multiplexers 53(d) and 54(e) conditioned to connect the flip-flops 50(d) and 52(e) in their respective series, at each successive tick of the SCAN CLK scan clock signal (which corresponds to the DOM 1 CLK domain 1 clock signal), each flip-flop 50(d) and 52(e) will store the signal at its respective data input terminal, which as described above is provided by the respective preceding flip-flop 50(d−1) or 52(e−1), or the respective SCAN DATA signal in the case of flip-flops 50(1) and 52(1), by the associated multiplexers 53(d) and 54(e). After each flip-flop 50(d), 52(e) has stored the signal at its data input terminal "D," it will couple the signal through its data output terminal "Q," and the multiplexer 53(d+1), 52(e+1) will, in turn, provide the signal to the data input terminal D of its associated flip-flop 50(d+1), 52(e+1). Thus, at successive ticks of the SCAN CLK scan clock signal, the bits of the scan vector represented by the state of the signals provided to the flip-flop 50(1) and 52(1) will be shifted through the segments of the scan chain defined by respective flip-flops 50(d) and 52(e). It will be appreciated that, while the SCAN IN/OUT MODE signal is asserted, the processing circuitry 51 will be receiving the signals from the flip-flops 50(d) and may be generating output signals in response thereto which are coupled to the respective inputs of multiplexers 52(d), but the SCAN IN/SCAN OUT MODE signal, by enabling each multiplexer 52(e) to couple the signal from the preceding flip-flop 52(e−1) in the scan chain (or, in the case of multiplexer 52(1), the SCAN DATA signal provided thereto) to its respective flip-flop 52(e), the output signals from the processing circuitry 51 will be ignored. Similar operations will generally occur both when the test scan vector is being scanned into the device 10 during a test vector loading operation (item (1) above), and when the result scan vector is being scanned out of the device 10 during a result vector retrieval operation (item (iii) above).

Accordingly, when the SCAN IN/OUT MODE signal and TEST MODE CLK signal are both asserted, which occurs both when the test scan vector is being scanned into the device 10, and when the result scan vector is being scanned out of the device 10, the multiplexers 55(*d*), 56(*e*) will ensure that the scanning will be performed under control of the SCAN CLK scan clock signal. On the other hand, when the SCAN IN/OUT MODE signal is negated and the TEST MODE CLK signal still asserted, which occurs during processing of the scan vector (item (ii) above), the multiplexers 55(*d*), 56(*e*) will ensure that processing operations performed by the circuit element 30(2)(m) will be performed under control of the SCAN CLK signal clock signal. Since the SCAN CLK scan clock signal corresponds to the DOM 1 CLK domain 1 clock signal, the multiplexers 55(*d*), 56(*e*) provided in the circuit element 30(2)(m) and the asserted SCAN IN/OUT MODE signal will ensure that the scan vector is loaded (item (i) above), processed (item (ii) above) and retrieved (item (iii) above) using a single clock signal, effectively providing a single clock domain for the device 10 during those operations. On the other hand, when the TEST MODE CLK signal is asserted, the multiplexers 55(*d*), 56(*e*) are enabled to restore control of the clock 2 domain 11 to the DOM 2 CLK domain 2 clock signal for normal operations. In any case, since the device 10 effectively forms a single clock domain during loading, processing and retrieval of the scan vector, the scan vector can be loaded, processed and retrieved without requiring, for example, synchronizers or other circuit elements to synchronize the transfer of the scan vector between components of the respective clock domains.

The invention provides a number of advantages. In particular, the invention provides an arrangement for simplifying a scan chain in a device, such as device 10, comprising two or more clock domains, without requiring complex synchronizing circuitry for synchronizing transfer of information between clock domains along the scan chain. The invention accomplishes this by effectively providing a single clock domain for controlling the loading, processing and retrieval of test and result scan vectors into and out of the device, which clock domain may be controlled by any of the clock signals that control the various clock domains of the device, or by another clock signal provided to the device to control loading and retrieval of the scan vector. The invention can help simplify the process of implementing and laying out the device 10, since it requires minimal additional circuitry, in particular the addition of the clock signal multiplexers 55(*d*) and 56(*e*) to each of the storage elements in the scan chain in those clock domain(s) in which the scan clock differs from the clock signal which normally controls the domain, and substantially the same circuitry may be provided for every such storage element in those portions of the scan chain.

It will be appreciated that numerous modifications may be made to the invention as described above in connection with FIGS. 1 through 3. For example, although only one connection is shown for the scan chain between clock domains, namely, the connection represented by line 37(N) (FIG. 1), it will be appreciated that numerous connections may be provided between clock domains for the scan chain. Preferably, the scan chain will be laid out so as to link proximate storage elements in the scan chain, and, depending on the actual layout of device 10, there may be a number of locations in which proximate storage elements are from different clock domains.

In addition, it will be appreciated that the specific circuit elements 20(1)(n) and 30(2)(m) described above in connection with FIGS. 2 and 3 are illustrative only, and that the respective clock domains may comprise circuit elements which differ from circuit elements 20(1)(n) and 30(2)(m). For example, although each circuit element has been described as comprising one or more input storage elements 40(*f*), 50(*d*) and one or more output storage elements 42(*g*), 52(*e*), it will be appreciated that circuit elements may be deemed to include only input storage elements or output storage elements; illustratively, the output storage element (s) of one circuit element may actually comprise the input storage element(s) of another storage element.

Further, although each of the storage elements 40(*f*), 42(*g*) of the circuit element 20(1)(n) of the clock 1 domain that provides the SCAN CLK scan clock signal, have been described as being associated only with a single multiplexer, namely, the multiplexer 43(*f*), 44(*g*) which controls establishment of the scan chain, it will be appreciated that clock multiplexers similar to multiplexers 55(*d*), 56(*e*) may also be provided for the storage elements 40(*f*), 42(*g*). Such clock multiplexers will preferably be provided for storage elements 40(*f*), 42(*g*) if a separate clock signal (other than the DOM 1 CLK domain 1 clock signal) is provided to control loading and retrieval of the scan vector, but they may also be provided if the DOM 1 CLK domain 1 clock signal is used to control loading and retrieval of the scan vector.

In addition, while, in the circuit elements 20(1)(n) and 30(2)(m) described above in connection with FIGS. 2 and 3, the segments of the scan chain extend along the respective series of input flip-flops 40(*f*), 50(*d*), and along the respective series of output flip-flops 42(*g*), 52(*e*), as described above the scan chain will preferably be laid out so as to link proximate storage elements, and so the segments may not extend along all of the input flip-flops or output flip-flops of the circuit elements comprising device 10, but instead may interconnect flip-flops of respective circuit elements 20(1)(n) and 30(2)(m), and respective clock domains 11 and 12, in a complex pattern.

Furthermore, it will be appreciated that processing circuitry 41 and 51 may comprise any form of processing circuitry.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. A digital circuit device comprising:
  A. a plurality of circuit elements defining a plurality of clock domains, the ones of the circuit elements in each clock domain being adapted to perform operations under control of a respective one of a plurality of domain clock signals, at least one of said domain clock signals having a timing characteristic which differs from that of another of said domain clock signals;
  B. a scan chain establishment element adapted to interconnect said circuit elements in an input scan chain to facilitate loading of a scan vector into said plurality of circuit elements; and
  C. a unitary clock domain establishment element adapted to establish a unitary clock domain for said circuit elements when said scan chain establishment element is interconnecting said circuit elements in said input scan chain.

2. A digital circuit device as defined in claim 1 in which said unitary clock domain establishment element operates under control of a clock domain control signal to selectively establish said unitary clock domain, the unitary clock domain establishment element enabling said circuit elements to operate under control of a unitary clock signal when said clock domain control signal enables said unitary clock domain establishment element enables said circuit elements to establish said unitary clock domain.

3. A digital circuit element as defined in claim 2 in which said clock domain establishment element enables said circuit elements to operate under control of one of said respective clock domain signals.

4. A digital circuit device as defined in claim 1 in which said circuit elements are enabled to perform a processing operation after said scan vector has been loaded.

5. A digital circuit device as defined in claim 4 in which said unitary clock domain establishment element is further adapted to establish said unitary clock domain when said circuit elements are enabled to perform said processing operation.

6. A digital circuit device as defined in claim 1 in which:
   A. said scan chain establishment element is further adapted to interconnect circuit elements in an output scan chain to facilitate retrieval of said scan vector from said digital circuit device; and
   B. said unitary clock domain establishment element is further adapted to establish said unitary clock domain for said circuit element when said scan chain establishment element is interconnecting said circuit elements in said output scan chain.

7. A digital circuit device as defined in claim 1 in which at least some of said circuit elements include respective storage devices, said scan chain establishment element including, associated with at least one of said storage devices, a data multiplexer adapted to normally couple digital data from processing circuitry to said at least one of said storage devices, the data multiplexer being responsive to a scan mode signal enabling said scan chain establishment element to establish said scan chain adapted to selectively couple digital data comprising a portion of said scan vector from another of said storage devices to said at least one storage device thereby to enable said portion of said scan vector to be loaded into said at least one of said storage devices.

8. A digital circuit device as defined in claim 7 in which said unitary clock domain establishment element includes, associated with said at least one of said storage devices, a clock multiplexer adapted to normally couple the one of the domain clock signals associated with its circuit element's clock domain to clock said at least one of said storage devices, the clock multiplexer being responsive to a clock mode control signal to enable a unitary clock signal to clock said at least one of said storage devices.

9. A digital circuit device as defined in claim 8 in which said storage devices have associated therewith respective clock multiplexers adapted to normally couple the one of the domain clock signals associated with respective ones of their respective circuit element's clock domain to clock said respective ones of said of said storage devices, the respective ones of said clock multiplexers being responsive to a unitary clock mode control signal to enable a unitary clock signal to clock said respective ones of said storage devices, thereby to establish said unitary clock domain.

10. A digital circuit device as defined in claim 8 in which:
   A. one of said domain clock signals, associated with one of said clock domains, comprises said unitary clock signal, and
   B. ones of said storage devices associated with another of said clock domains have associated therewith respective clock multiplexers adapted to normally couple the one of the domain clock signals with said other of said clock domains to their respective circuit element's clock domain to clock said respective ones of said of said storage devices, the respective ones of said clock multiplexers being responsive to a unitary clock mode control signal to enable said one of said domain clock signals to clock said respective ones of said storage devices, thereby to establish said unitary clock domain.

11. A digital circuit device as defined in claim 1 in which said timing characteristic is frequency, such that the frequency of the domain clock signal associated with one of said clock domains differs from the frequency of the domain clock signal associated with at least another of said clock domains.

12. A digital circuit device as defined in claim 1 in which said timing characteristic is phase such that the phase of the domain clock signal associated with one of said clock domains differs from the phase of the domain clock signal associated with at least another of said clock domains.

13. A method of operating a digital circuit device comprising a plurality of circuit elements defining a plurality of clock domains, the ones of the circuit elements in each clock domain being adapted to perform operations under control of a respective one of a plurality of domain clock signals, at least one of said domain clock signals having a timing characteristic which differs from that of another of said domain clock signals, the method comprising the steps of:
   A. controllably interconnecting said circuit elements in an input scan chain to facilitate loading of a scan vector into said plurality of circuit elements; and
   B. controllably establishing a unitary clock domain for said circuit elements when said scan chain establishment element is interconnecting said circuit elements in said input scan chain.

14. A method as defined in claim 13 in which said unitary clock domain establishment step is enabled by a clock domain control signal.

15. A method as defined in claim 14 in which, in the absence of said clock domain control signal, said circuit elements to operate under control of one of said respective clock domain signals.

16. A method as defined in claim 13 further including the step of enabling said circuit elements to perform a processing operation after said scan vector has been loaded.

17. A method as defined in claim 16 in which said unitary clock domain establishment step includes the step of establishing said unitary clock domain when said circuit elements are enabled to perform said processing operation.

18. A method as defined in claim 13 further comprising the steps of:
   A. controllably interconnecting circuit elements in an output scan chain to facilitate retrieval of said scan vector from said digital circuit device; and
   B. controllably establishing said unitary clock domain for said circuit element when said scan chain establishment element is interconnecting said circuit elements in said output scan chain.

19. A method as defined in claim 13 in which at least some of said circuit elements include respective storage devices, said scan chain establishment step including the steps of:
   A. normally coupling digital data from processing circuitry to at least one of said storage devices,
   B. responsive to a scan mode signal, establishing said scan chain adapted to selectively couple digital data comprising a portion of said scan vector from another of said storage devices to said at least one storage device thereby to enable said portion of said scan vector to be loaded into said at least one of said storage devices.

20. A method as defined in claim 19 in which said unitary clock domain establishment step includes the steps of, for said at least one of said storage devices, A. normally coupling the one of the domain clock signals associated with its circuit element's clock domain to clock said at least one of said storage devices, and B. responsive to a clock mode control signal, enabling a unitary clock signal to clock said at least one of said storage devices.

21. A method defined in claim 20 in which, for said storage devices, said unitary clock domain establishment step include the steps of A. normally coupling the one of the domain clock signals associated with respective ones of respective circuit element's clock domain to respective ones of said storage devices to clock said respective ones of said of said storage devices, B. responsive to a unitary clock mode control signal, enabling said unitary clock signal to clock said respective ones of said storage devices, thereby to establish said unitary clock domain.

22. A method as defined in claim 20 in which:

A. one of said domain clock signals, associated with one of said clock domains, comprises said unitary clock signal, B. for ones of said storage devices associated with another of said clock domains:

i. the one of the domain clock signals with said other of said clock domains is normally coupled to their respective circuit element's clock domain to clock said respective ones of said of said storage devices, ii. responsive to a unitary clock mode control signal, enabling said one of said domain clock signals to clock said respective ones of said storage devices, thereby to establish said unitary clock domain.

23. A method as defined in claim 13 in which said timing characteristic is frequency, such that the frequency of the domain clock signal associated with one of said clock domains differs from the frequency of the domain clock signal associated with at least another of said clock domains.

24. A method as defined in claim 13 in which said timing characteristic is phase such that the phase of the domain clock signal associated with one of said clock domains differs from the phase of the domain clock signal associated with at least another of said clock domains.

25. A digital circuit device computer program product for enabling a digital data processor to emulate a digital circuit device, said digital circuit device computer program product comprising:

A. a circuit element module adapted to enable said processor to emulate a plurality of circuit elements defining a plurality of clock domains, the ones of the circuit elements in each clock domain performing operations under control of a respective one of a plurality of domain clock signals, at least one of said domain clock signals having a timing characteristic which differs from that of another of said domain clock signals;

B. a scan chain establishment module adapted to enable said processor to emulate interconnection of said circuit elements in an input scan chain to facilitate loading of a scan vector into said plurality of circuit elements; and C. a unitary clock domain establishment module adapted to enable said processor to emulate establishment of a unitary clock domain for said circuit elements when said scan chain establishment element is interconnecting said circuit elements in said input scan chain.

26. A digital circuit device computer program product as defined in claim 25 in which said unitary clock domain establishment module enables said processor to emulate operation of said circuit element under control of a clock domain control signal to selectively establish said unitary clock domain, the unitary clock domain establishment module enabling said processor to emulate enabling circuit elements to operate under control of a unitary clock signal when said clock domain control signal enables said unitary clock domain establishment element enables said circuit elements to establish said unitary clock domain.

27. A digital circuit element computer program product as defined in claim 26 in which said clock domain establishment module enables said processor to emulate enabling said circuit elements to operate under control of one of said respective clock domain signals.

28. A digital circuit device computer program product as defined in claim 25 further comprising a processing operation control module for enabling said processor to emulate enabling said circuit elements to perform a processing operation after said scan vector has been loaded.

29. A digital circuit device computer program product as defined in claim 28 in which said unitary clock domain establishment module further enables said processor to establish said unitary clock domain when said circuit elements are enabled to perform said processing operation.

30. A digital circuit device computer program product as defined in claim 25 in which:

A. said scan chain establishment module is further adapted to enable said processor to emulate interconnection of said circuit elements in an output scan chain to facilitate retrieval of said scan vector from said digital circuit device; and B. said unitary clock domain establishment module is further adapted to enable said processor to emulate establishment of said unitary clock domain for said circuit element when said scan chain establishment element is interconnecting said circuit elements in said output scan chain.

31. A digital circuit device computer program product as defined in claim 25 in which circuit element module is adapted to enable said processor emulate at least some of said circuit elements to include respective storage devices, said scan chain establishment module enabling said processor to emulate including, associated with at least one of said storage devices, a data multiplexer adapted to normally couple digital data from processing circuitry to said at least one of said storage devices, the data multiplexer being responsive to a scan mode signal enabling said scan chain establishment element to establish said scan chain adapted to selectively couple digital data comprising a portion of said scan vector from another of said storage devices to said at least one storage device thereby to enable said portion of said scan vector to be loaded into said at least one of said storage devices.

32. A digital circuit device computer program product as defined in claim 31 in which said unitary clock domain establishment module enables said processor to emulate including, associated with said at least one of said storage devices, a clock multiplexer adapted to normally couple the one of the domain clock signals associated with its circuit element's clock domain to clock said at least one of said storage devices, the clock multiplexer being responsive to a clock mode control signal to enable a unitary clock signal to clock said at least one of said storage devices.

33. A digital circuit device computer program product as defined in claim 32 in which said circuit element module is adapted to enable said processor to emulate said storage devices having associated therewith respective clock multiplexers adapted to normally couple the one of the domain clock signals associated with respective ones of their respective circuit element's clock domain to clock said respective ones of said of said storage devices, the respective ones of said clock multiplexers being responsive to a unitary clock mode control signal to enable a unitary clock signal to clock said respective ones of said storage devices, thereby to establish said unitary clock domain.

34. A digital circuit device computer program product as defined in claim 32 in which said unitary clock domain establishment module enables said processor to emulate:
   A. providing one of said domain clock signals, associated with one of said clock domains, as said unitary clock signal, and
   B. providing ones of said storage devices associated with another of said clock domains to have associated therewith respective clock multiplexers adapted to normally couple the one of the domain clock signals with said other of said clock domains to their respective circuit element's clock domain to clock said respective ones of said of said storage devices, the respective ones of said clock multiplexers being responsive to a unitary clock mode control signal to enable said one of said domain clock signals to clock said respective ones of said storage devices, thereby to establish said unitary clock domain.

35. A digital circuit device computer program product as defined in claim 25 in which said circuit element module, said scan chain establishment module, and said unitary clock domain establishment module comprise code modules encoded on a computer-readable medium.

36. A digital circuit device computer program product as defined in claim 25 in which said timing characteristic is frequency, such that the frequency of the domain clock signal associated with one of said clock domains differs from the frequency of the domain clock signal associated with at least another of said clock domains.

37. A digital circuit device computer program product as defined in claim 25 in which said timing characteristic is phase such that the phase of the domain clock signal associated with one of said clock domains differs from the phase of the domain clock signal associated with at least another of said clock domains.

38. A digital circuit element comprising:
   A. a digital storage device including a data input terminal for receiving an input data signal and a clock input terminal for receiving a clock input signal, the digital storage device storing digital data represented by said input data signal in response to successive ticks of the clock input signal;
   B. a data multiplexer responsive to a data selection control signal for selectively coupling data from a plurality of diverse data sources as said input data signal to said data input terminal; and
   C. a clock multiplexer responsive to a clock selection control signal for selectively coupling clock signals from a plurality of diverse clock signal sources as said clock input signal to said clock input terminal.

* * * * *